(12) United States Patent
Goldsman et al.

(10) Patent No.: US 12,527,055 B2
(45) Date of Patent: Jan. 13, 2026

(54) FABRICATION OF SILICON CARBIDE INTEGRATED POWER MOSFETS ON A SINGLE SUBSTRATE

(71) Applicant: CoolCAD Electronics, LLC, College Park, MD (US)

(72) Inventors: Neil Goldsman, Takoma Park, MD (US); Akin Akturk, Gaithersburg, MD (US); Zeynep Dilli, Rockville, MD (US); Mitchell Adrian Gross, Baltimore, MD (US); Usama Khalid, Hanover, MD (US); Christopher James Darmody, Laurel, MD (US)

(73) Assignee: CoolCAD Electronics, LLC, College Park, MD (US)

( * ) Notice: Subject to any disclaimer, the term of this patent is extended or adjusted under 35 U.S.C. 154(b) by 1087 days.

(21) Appl. No.: 17/533,943

(22) Filed: Nov. 23, 2021

(65) Prior Publication Data

US 2022/0115502 A1 Apr. 14, 2022

Related U.S. Application Data

(63) Continuation-in-part of application No. 17/231,723, filed on Apr. 15, 2021, now abandoned.
(Continued)

(51) Int. Cl.
*H10D 62/832* (2025.01)
*H01L 21/762* (2006.01)
(Continued)

(52) U.S. Cl.
CPC ... *H10D 62/8325* (2025.01); *H01L 21/76224* (2013.01); *H10D 30/0223* (2025.01);
(Continued)

(58) Field of Classification Search
CPC ............ H01L 21/76224; H10D 30/603; H10D 64/257; H10D 84/01
See application file for complete search history.

(56) References Cited

U.S. PATENT DOCUMENTS

| 4,084,175 A | 4/1978 | Ouyang |
| 5,231,038 A | 7/1993 | Yamaguchi et al. |
| (Continued) | | |

OTHER PUBLICATIONS

Non-final Office Action issued in U.S. Appl. No. 17/231,723 on Apr. 10, 2023.
(Continued)

*Primary Examiner* — Ali Naraghi
(74) *Attorney, Agent, or Firm* — NovoTechIP International PLLC

(57) ABSTRACT

Fabrication method for a SiC integrated circuit which allows multiple power MOSFETs or LDMOSs to exist in the same piece of semiconductor substrate and still function as individual devices which form the components of a given circuit architecture, for example, and not by limitation, in a half-bridge module. In one example, a deep isolation trench is etched into the silicon carbide substrate surrounding each individual LDMOS device. The trench is filled with an insulating material. The depth of the trench may be deeper than the thickness of an epitaxial layer to ensure electrical isolation between the individual epitaxial layer regions housing the individual LDMOSs. The width of the trench may be selected to withstand the potential difference between the bias levels of the body regions of neighboring power LDMOS devices.

15 Claims, 11 Drawing Sheets

Related U.S. Application Data

(60) Provisional application No. 63/089,591, filed on Oct. 9, 2020.

(51) Int. Cl.
  *H10D 30/01* (2025.01)
  *H10D 62/17* (2025.01)
  *H10D 62/834* (2025.01)

(52) U.S. Cl.
  CPC ....... *H10D 30/0285* (2025.01); *H10D 62/393* (2025.01); *H10D 62/834* (2025.01)

(56) References Cited

U.S. PATENT DOCUMENTS

| | | | |
|---|---|---|---|
| 5,418,391 A | 5/1995 | Huang | |
| 6,096,590 A | 8/2000 | Chan et al. | |
| 7,821,082 B1 * | 10/2010 | Lin | H10D 30/603 257/492 |
| 2007/0215918 A1 | 9/2007 | Ito et al. | |
| 2008/0083956 A1 | 4/2008 | Mise et al. | |
| 2011/0193171 A1 * | 8/2011 | Yamagiwa | H10D 8/00 257/355 |
| 2011/0260245 A1 * | 10/2011 | Liu | H10D 84/83 257/E21.546 |
| 2012/0235165 A1 | 9/2012 | Harada et al. | |
| 2015/0048448 A1 * | 2/2015 | Chen | H01L 21/76224 438/296 |
| 2017/0287912 A1 * | 10/2017 | Tokumitsu | H10D 62/378 |
| 2018/0082887 A1 * | 3/2018 | Aika | H01L 21/30604 |
| 2018/0202070 A1 | 7/2018 | Asamizu | |
| 2019/0172912 A1 | 6/2019 | Hirose et al. | |

OTHER PUBLICATIONS

Final Office Action issued in U.S. Appl. No. 17/231,723 on Oct. 19, 2023.

* cited by examiner

FABRICATION OF SILICON CARBIDE INTEGRATED POWER MOSFETS ON A SINGLE SUBSTRATE

BACKGROUND

Silicon Carbide (SiC) power devices are intended to operate at high voltages and currents for applications such as power conditioning and conversion. Prior art SiC power devices consist of discrete devices and are not integrated together on a single die. For a circuit which requires more than one SiC device, for example a "half-bridge" circuit for DC-DC conversion, separate discrete devices must be combined together. The discrete devices are typically combined together by soldering them individually on to a printed circuit board or packaging them in a multi-chip module. This required method of fabricating circuits from discrete devices increases fabrication costs. More importantly, the increased volume and weight of the resulting module is a disadvantage for applications for which volume and weight are at a premium, for instance, space applications. Moreover, such systems that are combinations of discrete devices are naturally more vulnerable to harsh environmental elements and are therefore less robust in terms of reliability. Furthermore, the unavoidable added resistive and capacitive parasitic effects from such methods of combining discrete devices to build a circuit has adverse effects on the power effect and performance of the resulting module.

Current manufacturing methods of SiC power MOSFETs result in all the MOSFET devices fabricated on a single semiconductor wafer sharing their drain regions, their drift regions, or their body regions. As a result, these devices can only function as discrete MOSFET devices or as individual components in a circuit after the wafer has been diced into single devices.

SUMMARY

This present disclosure aims to address the aforementioned problems by describing a method of fabricating and utilizing multiple silicon carbide (SiC) power devices, in particular laterally-diffused metal-oxide-semiconductor field effect transistor (LDMOSFET) devices, on a single semiconductor die, in other words as a single integrated circuit that can be packaged in a single packaging and used as a self-contained module. This present disclosure describes a novel integrated structure and the fabrication method for the same which allows for multiple power MOSFETs or LDMOS devices to exist in the same piece of semiconductor die and still function as individual devices which form the components of a given circuit architecture, as examples, and not by limitation, in a half-bridge module or a full-bridge module having four LDMOS devices connected in a full bridge topology. Laterally-diffused metal-oxide-semiconductor field effect transistor (LDMOSFET) devices are hereinafter referred to as LDMOS devices as is commonly used in the industry.

In one embodiment, there is provided a method of forming a method of forming a Silicon Carbide (SiC) integrated circuit comprising: selecting a wafer for forming the SiC integrated circuit having a bulk layer with a first doping type and doping an epitaxial layer with a second doping type opposite of the first doping type to block current from flowing from the epitaxial layer to the bulk layer under normal voltage bias conditions and operation; forming a source region and a drain region for a first LDMOS device and a second LDMOS device in an epitaxial layer on the bulk layer; forming an isolation trench by etching between the first LDMOS device and the second LDMOS device, the isolation trench having sidewalls and a bottom; growing a thin layer of thermal oxide on the sidewalls and the bottom of the isolation trench; filling the isolation trench with an insulating trench fill material over the thermal oxide; forming in the epitaxial layer a body region of first LDMOS device and a body region of the second LDMOS device, wherein the body region of the first LDMOS and the body region of the second LDMOS device are electrically isolated from each other by the insolation trench, allowing the first LDMOS device and the second LDMOS device to exist on a same die and have different voltage bias levels maintained at body nodes of the first LDMOS and the second LDMOS device; completing the first LDMOS device and the second LDMOS device including forming gate structures and metallization layers; and packaging the first LDMOS device and second LDMOS device formed together in the epitaxial layer on the bulk layer of the SiC integrated circuit as a single semiconductor die in a single package.

In another embodiment, there is provided a method of forming a Silicon Carbide (SiC) integrated circuit comprising: selecting a wafer for forming the SiC integrated circuit having a bulk layer with a first doping type and doping an epitaxial layer with a second doping type opposite of the first doping type to block current from flowing from the epitaxial layer to the bulk layer under normal voltage bias conditions and operation; forming a source region and a drain region for a first LDMOS device and a second LDMOS device in an epitaxial layer on the bulk layer; forming an isolation trench by etching between the first LDMOS device and the second LDMOS device, the isolation trench having sidewalls and a bottom, wherein the isolation trench is etched sufficiently deep to go partially into the bulk layer to separate the body region of first LDMOS device and the body region of the second LDMOS device electrically, the trench completely surrounds the region within which each LDMOS device is defined, and the isolation trench has a minimum width to prevent dielectric breakdown due to a voltage difference created by different voltage levels set in the body region of first LDMOS device and the body region of the second LDMOS device; growing a thin layer of thermal oxide to the sidewalls and the bottom of the isolation trench; filling the isolation trench with an insulating trench fill material over the thermal oxide; forming in the epitaxial layer a body region of first LDMOS device and the second LDMOS device, wherein the body region of the first LDMOS and the body region of the second LDMOS device are electrically isolated from each other by the isolation trench, allowing the first LDMOS device and the second LDMOS device to exist on a same die and have different voltage bias levels maintained at body nodes of the first LDMOS and the second LDMOS device; completing the first LDMOS device and the second LDMOS device including forming gate structures and metallization layers; and packaging the first LDMOS device and second LDMOS device formed together in the epitaxial layer on the bulk layer of the Si integrated circuit as a single die in a single package.

An example embodiment for a Silicon Carbide (SiC) integrated circuit structure includes a first SiC laterally-diffused MOSFET (LDMOS) device and a second LDMOS device fabricated on a single semiconductor die, wherein: the single semiconductor die is cleaved from a semiconductor wafer comprising a substrate layer and an epitaxial layer, the substrate layer of the first LDMOS and of the second LDMOS includes a first doping type, the epitaxial layer of the first LDMOS and of the second LDMOS includes a second doping type opposite of the first doping type such that a lower substrate layer would block current flowing from a epitaxial layer above the lower layer under normal voltage bias conditions for the device operation, a body region of a first LDMOS is formed in the epitaxial layer and a body region of a second LDMOS is formed in the epitaxial layer, and body regions of the first LDMOS and the second LDMOS devices are isolated from each other electrically, allowing the first LDMOS device and the second LDMOS device to exist on a same die and have different voltage bias levels at body nodes of the first LDMOS and the second LDMOS devices. This isolation can be achieved by the use of guard ring structures and isolation trenches etched between the individual devices. It will be clear to one of ordinary skill in the art that the afore description is by example and not by limitation, and that this same approach can be used construct integrated circuits comprising more than two LDMOS devices on the same semiconductor die. Another example would be a full-bridge circuit, comprising four transistors.

DETAILED DESCRIPTION

Figure 1A:
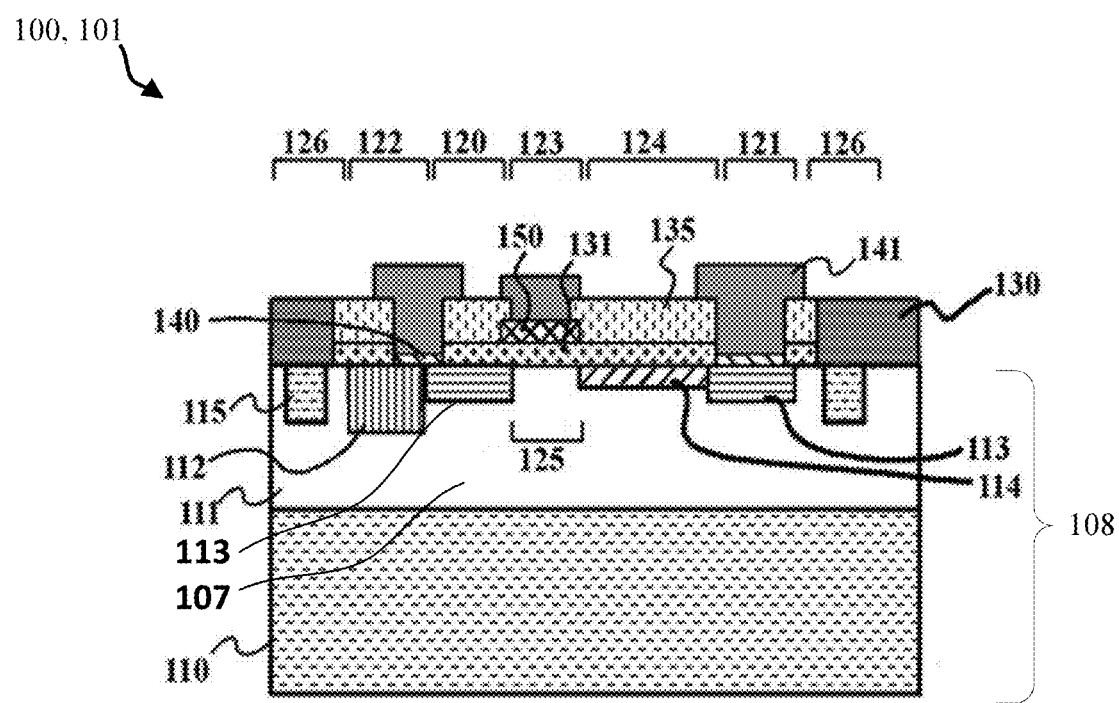
FIG. 1A illustrates the cross-sectional view of a silicon carbide device according to various aspects described herein.

Implementations will be described below in more detail with reference to the accompanying drawings. The following detailed descriptions are provided to assist the reader in gaining a comprehensive understanding of the methods, devices, circuits, and/or systems described herein as well as modifications thereof. Accordingly, various modifications and equivalents of the methods, devices, circuits, and/or systems described herein will be apparent to those of ordinary skill in the art. Descriptions of well-known functions, steps, and constructions may be omitted for increased clarity and conciseness.

Furthermore, the terms used herein are intended to describe implementations and shall by no means be restrictive. Unless clearly used otherwise, expressions in a singular form include a meaning of plural form. An expression such as "comprising" or "including" is intended to designate a characteristic, a feature, a step, an operation, an element, a part or combinations thereof, and shall not be construed to preclude any presence or possibility of one or more other characteristics, features, steps, operations, elements, parts or combinations thereof.

Prior methods of manufacturing SiC power MOSFET devices suffered from the technical problem that the devices could only function as discrete MOSFET devices in a circuit after the wafer, on which the devices were fabricated, had been diced into single devices because the devices shared a single drain region at fabrication. This present disclosure overcomes this technical problem by providing a method of fabricating multiple SiC power devices, in particular laterally-diffused metal-oxide-semiconductor field effect transistor (LDMOS) devices, in a single semiconductor die, in other words as a single integrated circuit that can be packaged in a single packaging and used as a self-contained module. This novel integrated structure and the fabrication method allows for multiple power MOSFETs or LDMOSs to exist in the same piece of semiconductor die and still function as individual devices which form the components of a given circuit architecture, for example, in a half-bridge module.

The present disclosure relates to SiC circuits, including, without limitation, LDMOS devices, and their fabrication methods. In addition, the present disclosure relates to the methods of including more than one power LDMOS device on a single semiconductor die. The present disclosure also relates to the design of a structure that allows integrating more than one power LDMOS device on a single semiconductor die. Further, the present disclosure relates to integrated circuits that include silicon carbide as an operative material and their fabrication methods.

The implementations presented herein feature designs, structures, and fabrication methods of silicon carbide LDMOS devices that can be integrated in a single semiconductor die and operate at temperatures in excess of 400 degrees Celsius. The implementations featured herein include a novel SiC integrated circuit structure which allows for multiple LDMOS devices to be integrated on a single semiconductor die in a circuit configuration, and operate as a single module, for example, as a half-bridge module for DC-to-DC conversion. Generally, the disclosure features aspects of the fabrication of and integrated circuit implementations of SiC MOSFETs. One of ordinary skill in the relevant art(s) will readily understand that these implementations may be adapted in more complex fabrication processes and/or in more complex integrated circuits, and this, without departing from the teachings featured herein.

In one implementation, there is described a structure which features two or more SiC LDMOS power devices included on the same piece of semiconductor. These devices are on a semiconductor wafer comprising a substrate and an epitaxial layer of the opposing doping type overlaying the substrate. The individual LDMOSs share the same semiconductor die and may include source, drain, body contact, drift, and edge termination regions shaped by doping, by ion implantation or another doping method as described below and illustrated in the accompanying drawings. These regions are placed such that the body contact region is on one end, next to it are the source region, the channel region, the drift region, and the drain region in that order, the drain region being on the other end. The edge termination region may be placed as to surround each individual device. The individual LDMOSs also include a gate oxide overlaying the channel region which falls between the source and the drift regions. The individual LDMOSs also include a gate material patterned over the gate oxide overlaying the channel region, annealed ohmic contacts to the source, drain, and body contact regions, and a contact area to the gate material. The individual LDMOSs also include a passivation layer covering all the regions except the ohmic contact regions and the contact to the gate material. The individual LDMOSs also include one or more layers of metallization to form the interconnects. To enable the integration of multiple LDMOSs on a single semiconductor die, a deep isolation trench is etched into the silicon carbide wafer surrounding each individual LDMOS device. The depth of this trench may be designed to be deeper than the thickness of the epitaxial layer to ensure electrical isolation between the individual epitaxial layer regions housing the individual LDMOSs. The width of the trench is designed to be able to withstand the potential difference between the bias levels of the body regions of neighboring power LDMOSs, or in other words, to resist dielectric breakdown. The trench is filled with an insulating material or combination of insulating materials by deposition and subsequent planarization. In one implementation, the SiC power LDMOS may be an N-channel MOSFET, in which case the substrate will be n-type, the drift region that the isolation trench has to etch completely through will be p-type, the source, drain and drift region implants will be n-type, and the body-contact and edge termination implants will be p-type. In another implementation, the SiC power LDMOS may be a P-channel MOSFET, in which case all the polarities may be reversed. In another implementation, the SiC power LDMOS may be a P-channel MOSFET, but the base substrate may once again be an n+-type substrate. In this implementation, instead of the single n-type epitaxial layer, there may be a p+-type epitaxial layer to serve as insulation between the top n-type epitaxial layer and the n+-type substrate at the bottom.

In one implementation, there is provided a method for fabricating a silicon carbide laterally-diffused metal-oxide-semiconductor device. Starting from a bare silicon carbide wafer comprising an n-type substrate completely covered with a p-type epitaxial layer, further n-type regions are created by dopant implementation or another doping method, to serve as the source, drain, and drift regions. Further p-type regions are created by a similar fabrication process to create the body contact and the edge termination regions. The wafer is then annealed at a high temperature for dopant activation. After a sacrificial oxide growth and removal step, field oxide is deposited on the whole wafer and etched down to the silicon carbide surface in the areas where a thin gate oxide will be grown. The gate oxide is grown by thermal oxidation. A gate material, polysilicon in some implementations, is then deposited and patterned to form the gate geometry over the channel regions. In the implementations where undoped polysilicon is used, the polysilicon is doped prior to patterning with a method such as implantation or spin-on dopant application and a drive-in anneal. The thin thermal oxide over the regions for forming ohmic contacts to the source, drain and body contact regions are then etched down to the surface, and a contact metal is deposited and patterned. Ohmic contacts are then formed by a rapid thermal annealing process. A passivation layer is then deposited over the full device and opened where a metal interconnect should make contact to either the contact metal regions, or the gate material. These openings, or vias, may optionally be filled by a metal deposition and patterning step. A metal layer is then deposited and patterned to form the metal 1 layer of interconnects. If more metal layers are required for circuit routing, another layer of interlayer dielectric may be deposited, and vias opened similarly in regions where the higher metal layer should make contact to the lower one. The process is then finalized by the deposition of a final passivation layer, opening this layer over areas where interconnects make contact to bonding/probing pads, and the deposition of extra metal if required over the bonding/probing pads.

In another implementation, there is provided a method for fabricating two or more SiC LDMOS devices integrated together on a single semiconductor die. The fabrication process proceeds in the same way as described above, starting from the same bare wafer. After the dopant activation step, deep isolation trenches are etched surrounding the areas where individual devices will be formed. The trench is required to be deep enough to go past the p-type epitaxial layer and reach the n-type substrate. In some implementations the etch process may be designed in order to yield a trench with vertical sidewalls. In some implementations the etch process may be designed in order to yield a trench with beveled sidewalls so as to increase the resilience to the potential difference between the two sides of the trench and make a breakdown less likely. The wafer then undergoes a short thermal oxidation process to line the sidewalls and bottom of this trench with a thin layer of thermal oxide. This thermal oxide also forms over the surface. Following this step, an insulating material, by example and not by limitation, such as $SiO_2$ is deposited thickly enough to fill the trench completely from the bottom to the surface. A method such as chemical-mechanical polishing is then used to planarize this material. If a material other than $SiO_2$ is used as a filling material, the thermal oxide grown just before the deposition may act as an etch-stop in the surface regions outside the trench in this process. If Sift is used as a filling material, another thin layer of another insulator such as $Si_3N_4$ may be deposited first prior to $SiO_2$ deposition, and this second thin layer may act as the etch-stop for the $SiO_2$ etching by chemical-mechanical polishing or another method. After this, the extra thermal oxide or the alternative etch-stop insulator is removed from the surface outside the trenches and processing proceeds as described above until all the devices and interconnects are formed. The nodes of the individual devices, all surrounded by isolation trenches, for which electrical connections are desired, are connected together with metal interconnects that bridge over the trenches, while the body regions remain isolated. As described, in other implementations, other materials may be used as the etch-stop and filling materials, respectively. For example, and not by limitation, insulator materials such as silicon dioxide (SiO2), or aluminum oxide (Al2O3), or undoped polysilicon, or various nitrides may also be used to fill the trench, and materials such as silicon nitride (Si3N4) or silicon dioxide (SiO2) may be chosen as the etch-stop material according to what the actual filling material is and the etching method. Other combinations of fill materials can be devised based on the electrical design requirements.

FIG. 1A illustrates the cross-sectional view of a SiC device 100 comprising a laterally-diffused MOSFET (LD-MOS) power device. The SiC device 100 may be a LDMOS 101, made in silicon carbide as the operative material. The LDMOS 101 is formed on the SiC semiconductor wafer or substrate 108 that includes an n-type silicon carbide bulk layer 110 which is topped with an epitaxial layer 111, which may be a p-type epitaxial layer. In one implementation, the epitaxial layer 111 may be substantially thinner than the bulk layer 110 region of the wafer. The doping of the epitaxial layer 111 may be of a doping type opposite of the doping type of the substrate or bulk layer 110 such that the lower substrate or bulk layer would block current flowing from a epitaxial layer above to the lower layer under normal voltage bias conditions for the device operation.

In the epitaxial layer 111, there may be formed n+ type regions 113. The n+ type regions 113 may be formed, for example and not by limitation, by ion implantation. Furthermore, in the epitaxial layer 111, there may be formed p+ type regions 112, also by ion implantation as a possible fabrication process. The n+ type regions 113 may be the source region 120 or drain region 121 of the LDMOS 101, and the p+ regions 112 may be the body contact region 122 to the body region 107 of the same device. In this case implementation, the LDMOS 101 is an N-channel LDMOS. The epitaxial layer portion surrounding and between the source region 120 and drain region 121 of the LDMOS 101 may form the body region 107 of the LDMOS 101. The body region is the entirety of the epitaxial layer that is not implanted when forming the other structures of the LDMOS device but is adjacent to the implanted regions. Furthermore, in the epitaxial layer 111, there may be formed n-type regions 114, also by ion implantation as a possible fabrication process. The n-type regions 114 may have a lower dopant level than the n+ type regions 113. The n-type regions 114 form the n-drift regions 124 of the LDMOS 101.

Furthermore, there may be formed p-type regions 115, also by ion implantation as a possible fabrication process. The p-type regions 115 may have a different dopant level than the p+ type regions 112. The p-type regions 115 may form the edge termination regions 126 of the LDMOS 101. The purpose of the edge termination region is to reduce the voltage drop across the isolation trench and help prevent dielectric breakdown. The edge termination region is implanted with a dopant of the same type and higher density than that of the body regions, thereby being electrically connected to the body regions and performing the termination function correctly. The edge termination regions may be rings, rectangles, or other circumferential geometries, encircling the LDMOS devices. A rectangular geometry for the termination region 126 is shown in FIG. 2B. Similarly, the isolation trench 127 may form a circumferential geometry (not shown) around the LDMOS devices.

The n-drift region 124 may stretch between the drain region 121 and the channel region 125 of the LDMOS 101 and extend laterally across the top of the device. This n-drift region 124 may allow for a large blocking voltage to be distributed across itself or drop across itself without a large voltage appearing at the gate location. This protects the gate oxide 131 from dielectric breakdown at the gate structure 123. Overlaying the channel region 125 of the LDMOS 101 is the gate structure 123, comprising an insulating gate dielectric or oxide layer referred to herein as gate oxide 131 and a gate material 150. Abutting the channel region 125 from the other side than the n-drift region 124 may be the source region 120, which may be next to the body contact region 122. As the LDMOS 101 device may be designed, the source and body contact regions may be permanently electrically shorted to each other.

The doping profiles that comprise the implant regions 112, 113, and 114, as well as the doping level of the epitaxial layer 111, and the geometric features such as the length of the channel region 125, and length of the n-drift region 124, are engineered such that a high current can flow in the on-state of the device, when a high voltage is applied both between the drain and the source and between the gate and the source of the LDMOS 101. At the same time, these aspects are engineered so that no dielectric or gate oxide breakdown is experienced in the off-state of the device, where a high voltage remains applied between the drain and the source whereas a low voltage, or even no voltage, is applied between the gate and the source.

In one implementation, the doping polarities of all the structures described above may be the opposite and the power LDMOS may thereby be a P-channel MOSFET. In one implementation, the substrate may be n-type and the epitaxial layer may be p-type, and an n-well region may be formed within the p-epitaxial layer within which are formed p+ type drain and source regions, p-type drift regions, n+ type body contact regions and n type edge termination regions. The devices so formed in this implementation may be P-channel MOSFETs. It will be clear to one of ordinary skill in the art that the descriptions here do not limit the possible ways to form N- or P-channel MOSFETs.

Figure 1B:
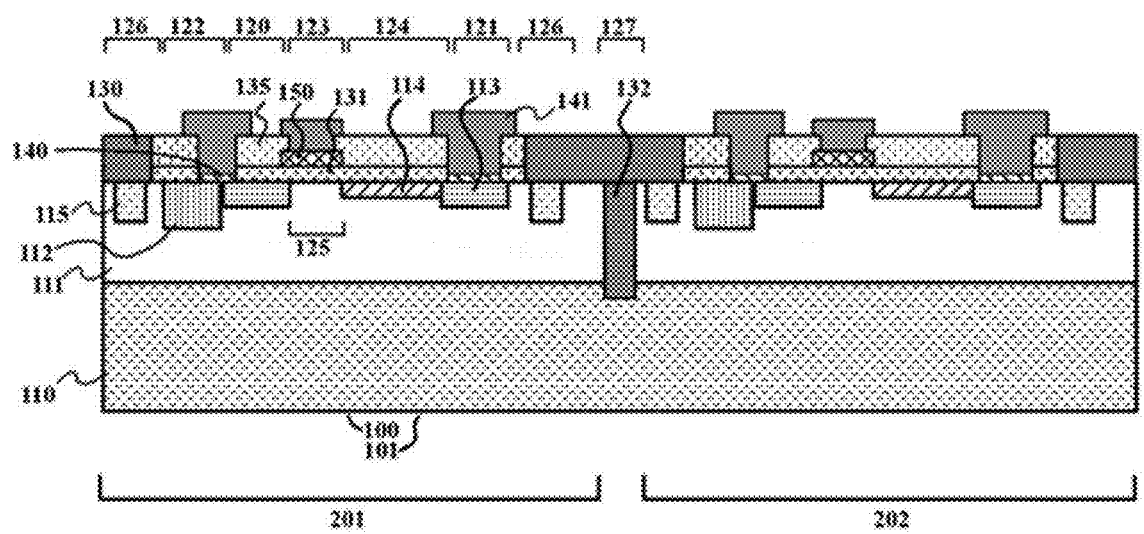
FIG. 1B illustrates the cross-sectional view of two silicon carbide devices integrated together as a single module according to various aspects described herein.

FIG. 1B illustrates the cross-sectional view of SiC devices integrated together as a single module according to various aspects described herein. In this figure are depicted two laterally-diffused MOS field effect transistor devices, LDMOS device 201 and LDMOS device 202, fabricated on a SiC semiconductor wafer or substrate 108. The substrate 108 includes a silicon bulk layer 110 covered with a p-type silicon carbide epitaxial layer ("p-epi") 111. For clarity, the individual parts are labeled only on the LDMOS device 201. In FIG. 1B, an isolation trench 127 may be etched completely through the epitaxial layer 111 in the region in between the two devices to be integrated together on the same semiconductor die. The isolation trench 127 has a depth sufficient to go completely through the epitaxial layer 111 and reach into the bulk layer 110 in order to guarantee electrical isolation between the individual epitaxial layer regions in which the LDMOS devices 201 and 202 are formed. An electrically insulating material 132 may be used to fill this isolation trench 127. This material may be, for example and not by limitation, silicon dioxide, or another insulating material or combination of materials. The isolation trench 127 has a width sufficient to prevent dielectric breakdown in this insulating material between individual neighboring devices which may have body regions biased at different potential levels.

Figure 1C:
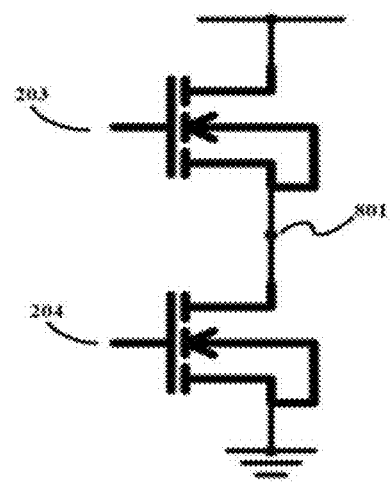
FIG. 1C illustrates the equivalent circuit schematic of and the electrical connection between the two individual silicon carbide devices integrated together as a single module as depicted in FIG. 1A, according to various aspects described herein.

FIG. 1C illustrates an example half-bridge circuit which can be implemented by the design in the present disclosure. LDMOSs 203 and 204 are to be implemented on a single SiC die, and the common node 801 which connects the source/body of LDMOS 203 to the drain of the LDMOS 204 is to be formed by a metal interconnect. Note that this connection is not shown in the integrated circuit cross-section of FIG. 1B. Similarly, a full bridge circuit (not shown) could be implemented with four LDMOS devices.

Figure 1D:
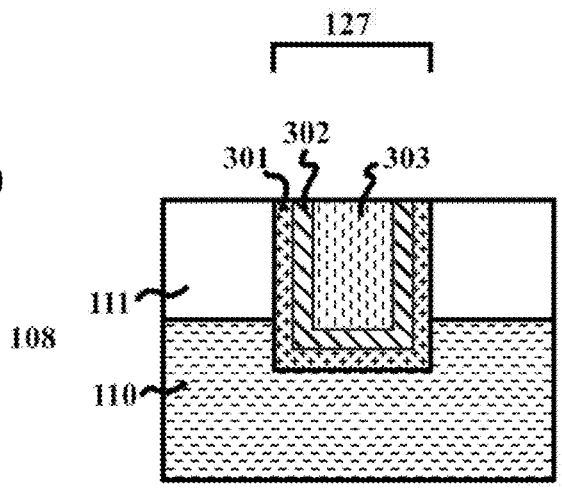
FIG. 1D illustrates an example of an isolation trench according to various aspects described herein.
Figure 1E:
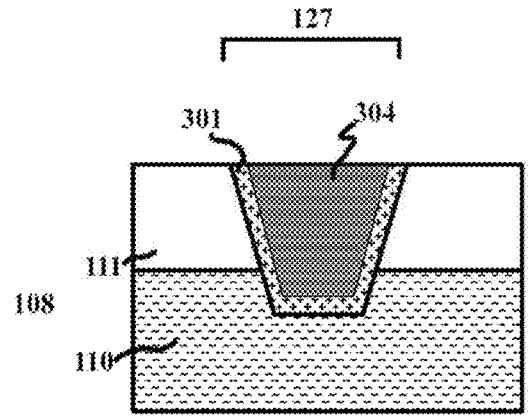
FIG. 1E illustrates another example of an isolation trench according to various aspects described herein.

FIGS. 1D and 1E show detailed cross-sections of example embodiments of the isolation trench. The embodiment shown in FIG. 1D features an isolation trench 127 with vertical sidewalls. The embodiment shown in FIG. 1E features an isolation trench 127 with beveled sidewalls. For both embodiments, the depth of the trench 127 goes past the depth of the epitaxial layer 111 into the substrate 110, separating the segments of the epitaxial layers to either side of the trench in both embodiments electrically. For both embodiments, the figure represents the area of the semiconductor die around the trench after fabrication has been completed. The structures, implants, surface oxide and passivation layers are not shown in FIGS. 1D and 1E for clarity. Within the trench in example embodiment of FIG. 1D, a layer of thermal oxide 301 is grown as a lining for the trench. Above this, an etch-stop layer 302 has been deposited, following which the rest of the trench is filled with the fill material 303. Within the trench in example embodiment of FIG. 1E, a layer of thermal oxide 301 is grown as a lining for the trench. After this, the rest of the trench is filled with the fill material 304. As described above, whether a separate etch-stop layer 302 is necessary or not depends on the choice of the fill material. FIG. 1D depicts an example where the etch-stop layer is necessary, whereas FIG. 1E depicts an example where the etch-stop layer is not needed. Whether the trench sidewalls are vertical or beveled is independent of the need or lack thereof for an etch-stop layer and therefore it would be obvious to one of ordinary skill in the art that the depiction of vertical sidewalls with a fill combination including an etch-stop layer or that of beveled sidewalls not including the same is not limiting the implementation. In FIG. 1B, as well as in the subsequent figures of this disclosure, the material or combination of materials filling trench 127 is shown and referred to as a single fill material 132 for clarity's sake.

Figure 2A:
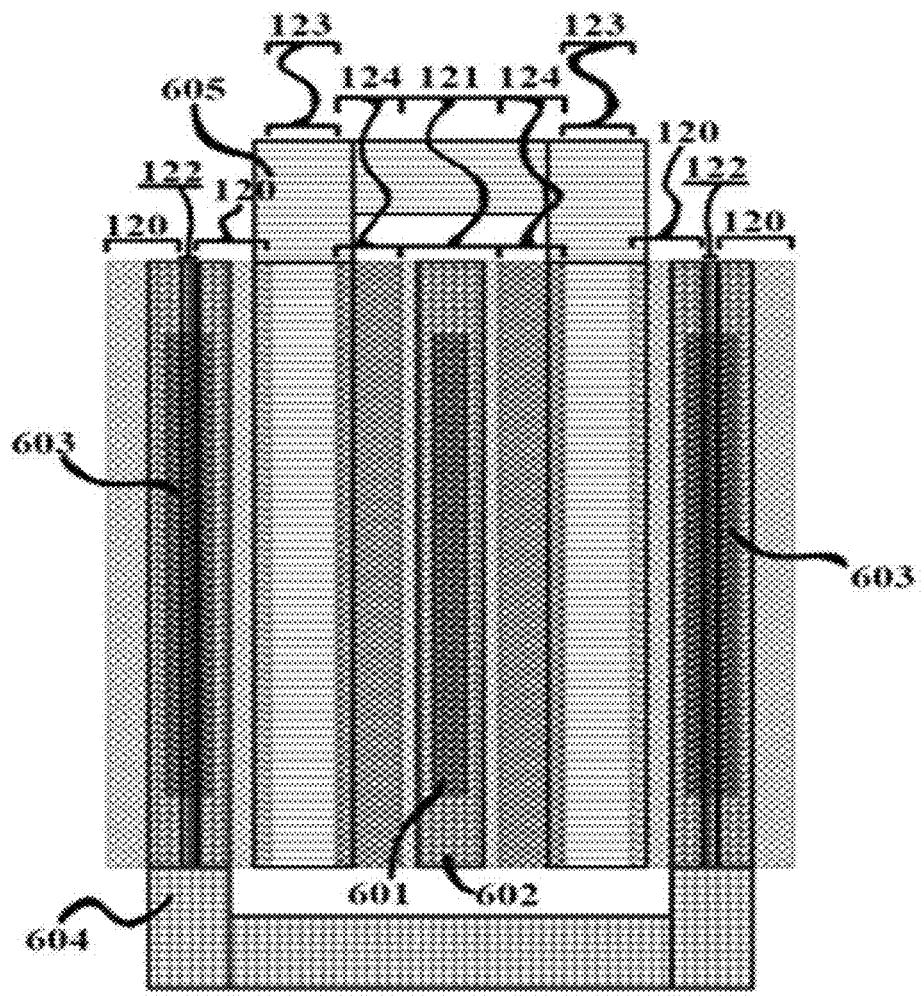
FIG. 2A illustrates the layout view of a segment of a silicon carbide device according to various aspects described herein.
Figure 2B:
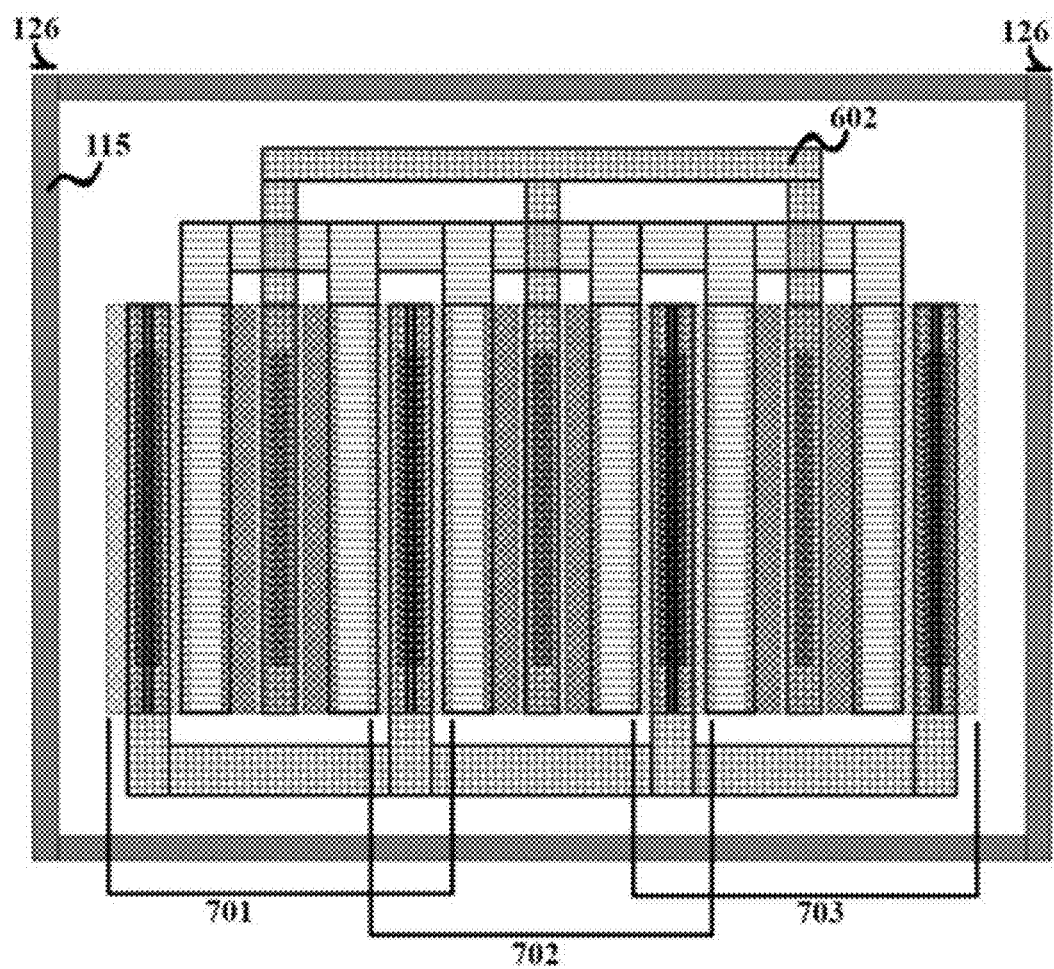
FIG. 2B illustrates the layout view of a silicon carbide device according to various aspects described herein.

FIG. 2A illustrates the layout or bird's-eye view of a single unit of a single SiC LDMOS device. Because these LDMOSs are high-power devices which need to be able to carry large amounts of current, the channel width/channel length ratio (or W/L ratio) of the MOSFET structure should be very high, as will be known to one of ordinary skill in the art. In order to achieve this high W/L ratio, individual unit cells as depicted in FIG. 2A are combined together into a single large LDMOS device as illustrated by example and not by limitation in FIG. 2B. To facilitate this combination, the unit cell of FIG. 2A is symmetric around a vertical center axis which passes through the middle of the drain implant and contact. On either edge, the source and body implants are shorted together and are contacted with the same contact metal area. These contacts are then brought together with metal interconnects, which will be routed to an interconnect that will be connected to the source/body potential point elsewhere on the chip. Note that the cross-section in FIG. 1A does not show this mirrored layout, but instead the equivalent of only the left half of FIG. 2A. Moreover, FIG. 1A shows the edge termination implants, which are not shown in FIG. 2A.

In FIG. 2A, the drain region 121 is in the center. In the middle is a drain contact region 601, covered by a metal interconnect 602 which contacts the drain region. The drain contact region 601 corresponds to drain contact region 141 in FIG. 1A. To either side there are two copies of the drift region 124. Beyond these are the gate structures 123, covered by a polysilicon gate material 605. The two polysilicon gate materials are connected as shown in the figure to allow for a single contact to both gate structures 123. Beyond these are the source regions 120 and body regions 122. Each source/body region pair are connected to the same contact metal region 603. Contact metal region 603 corresponds to contact metal region 140 in FIG. 1A. The two 603 regions are both covered by a metal interconnect 604 which allows for the two pairs of regions to be contacted together. There are extra source implant regions on the outer boundaries of the cell which will allow these unit cells to be stacked horizontally as will be depicted in FIG. 2B.

In FIG. 2B, three unit cells 701, 702 and 703, each including one of the layout depicted in FIG. 2A, are joined together edge-to-edge to create a single LDMOS with effective W/L ratio three times that of the single unit cell LDMOS. The metal interconnects 602 contacting the drain regions of each unit cell are joined together as the figure shows. The edge termination implant 115 surrounds the full device as the edge termination region 126.

Figure 3:
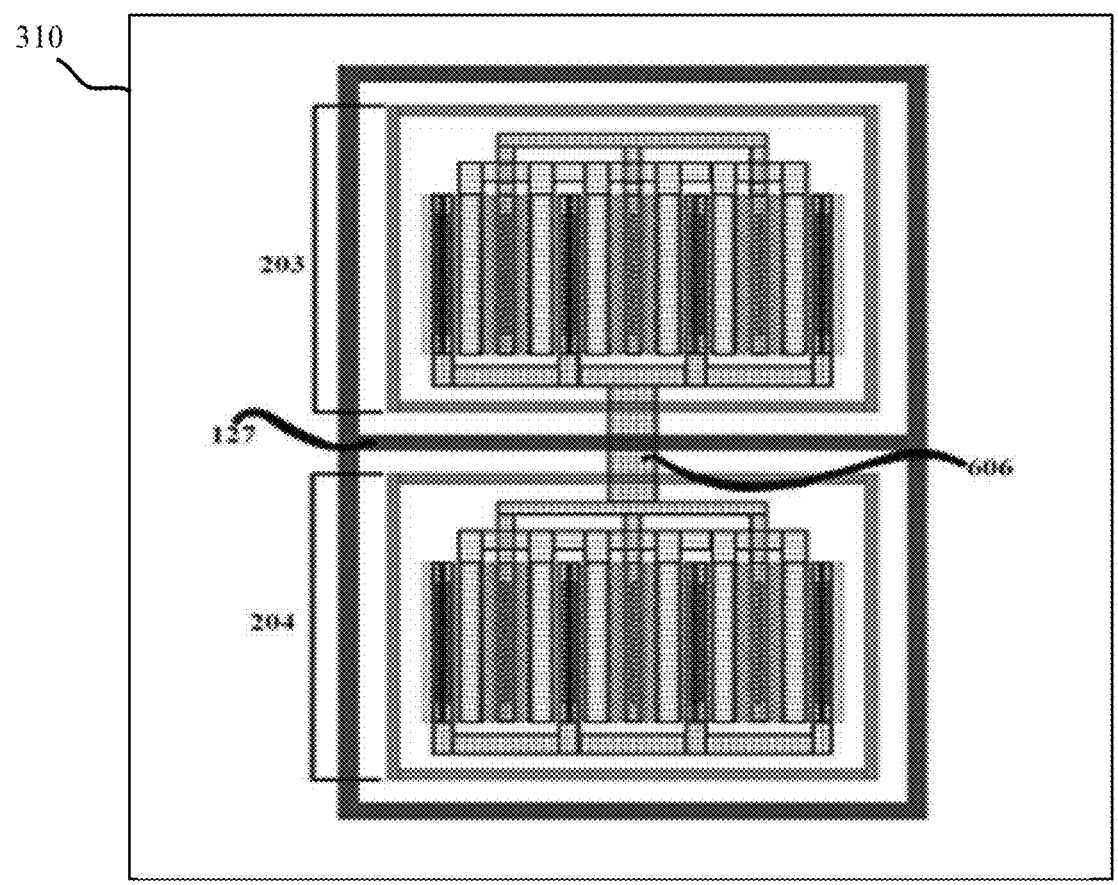
FIG. 3 illustrates a layout view of two silicon carbide devices integrated together as a single module to be fabricated on a single semiconductor die according to various aspects described herein.

In FIG. 3, two LDMOS devices 203 and 204, as individually depicted in FIG. 2B, are integrated together. Each device is surrounded by an isolation trench 127, which is also present between the devices. An extra metal interconnect 606 crosses over the trench to create a common electrical node the source/body-region interconnect of device 203 and drain interconnect of device 204. This creates the equivalent of the circuit architecture as depicted in FIG. 1C, with the metal interconnect 606 creating the common node 801 in FIG. 1C. It will be clear to one of ordinary skill in the art that other combinations of individual SiC LDMOS devices, including more than two LDMOS devices, to form other circuit architectures are possible. The two LDMOS devices 203, 204 may be diced into a single chip and placed into a single package 310, represented by the package outline 310.

It will also be clear to one of ordinary skill in the art that other geometries of unit cells, by example and not by limitation circular, square or hexagonal ones, and large W/L ratios built from these unit cells would be feasible to fulfill the same objective. It will also be similarly clear that even though FIG. 2B shows only three unit cells combined and surrounded by edge termination implants, the same geometry can be used to combine an arbitrary number of unit cells limited only by the semiconductor die size. It will further be similarly clear that the edge termination implant geometry may vary, with multiple ring regions surrounding each other and the device as another possible implementation. The purpose of the edge termination region is to reduce the voltage drop across the isolation trench and help prevent dielectric breakdown.

In the subsequent figures, the formation of two neighboring devices are shown simultaneously so as to make it possible to illustrate the fabrication process for creating an isolation trench between them, which is the feature that enables the integration of multiples of these devices within a single die. Moreover, for clarity only one unit cell of the LDMOS structures as depicted in the layout of FIG. 2A is presented as representative of the fabrication process for the whole device. It will be clear to one of ordinary skill in the art that the fabrication process is applicable to full LDMOS devices, as depicted by example in FIG. 2B, formed from multiple copies of the unit cell depicted in FIG. 2A. It will further be clear to one of ordinary skill in the art that this fabrication process which enables the integration of two LDMOS devices on the same semiconductor die is not limited solely to the integration of two devices, but can be applied to the integration of more. An example embodiment that features more than two LDMOS devices could be the implementation of the four active devices of a stepper-motor controller circuit on a single semiconductor die. It will further be clear that the integration method herein described can be adapted to integrate multiple N-channel power LDMOS devices, multiple P-channel power LDMOS devices, or a combination of both types, with the appropriate arrangement of epitaxial layers, depth choices for isolation trenches, and process modifications.

Figure 4:
FIG. 4 illustrates a fabrication process of a silicon carbide device according to various aspects described herein.

FIG. 4 shows the bare semiconductor material from which the fabrication of the module comprising multiple integrated SiC LDMOS devices on a single die may begin. The substrate may be, for example, and not by limitation, a 4H-SiC material. The bare semiconductor material can have the bulk layer 110 with the p-type epitaxial layer 111.

Figure 5:
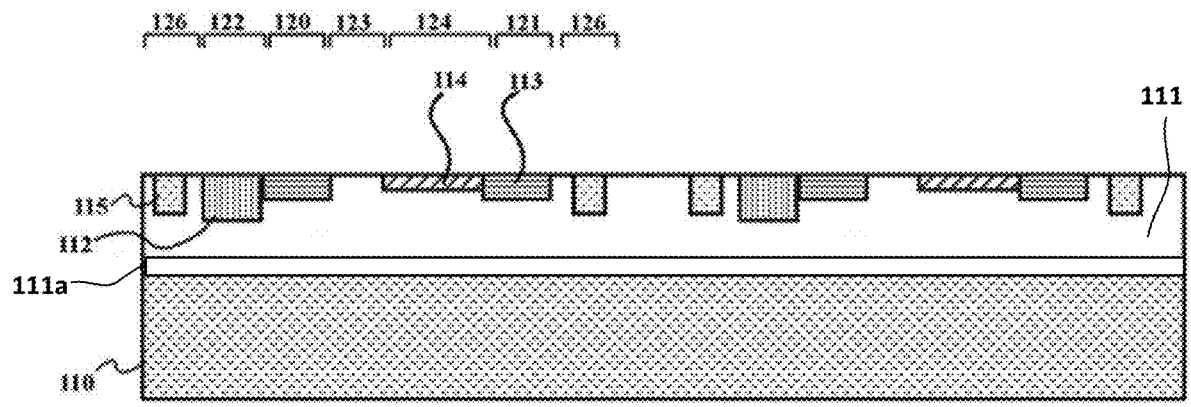
FIG. 5 illustrates a fabrication process of a silicon carbide device according to various aspects described herein.

FIG. 5 shows the implantation of the source and drain implants 113, which may end up forming the source region 120 and a drain region 121. FIG. 5 also shows the implantation of the body contact implant 112 and the drift-region implant 114, which may end up forming a body contact region 122 and an n-drift region 124. FIG. 5 also shows the implantation of an edge termination implant 115, which may form an edge termination region 126. In addition, FIG. 5 shows an optional epitaxial layer 111a, which may be of intrinsic SiC or may have the doping type that is opposite of that of the top epitaxial layer 111.

After the implantation processes are complete, the wafer on which fabrication is taking place may undergo a dopant activation process by being heated to temperatures higher than 1600° C. for durations between 5 to 15 minutes under an inert atmosphere before proceeding to the rest of fabrication steps.

Figure 6:
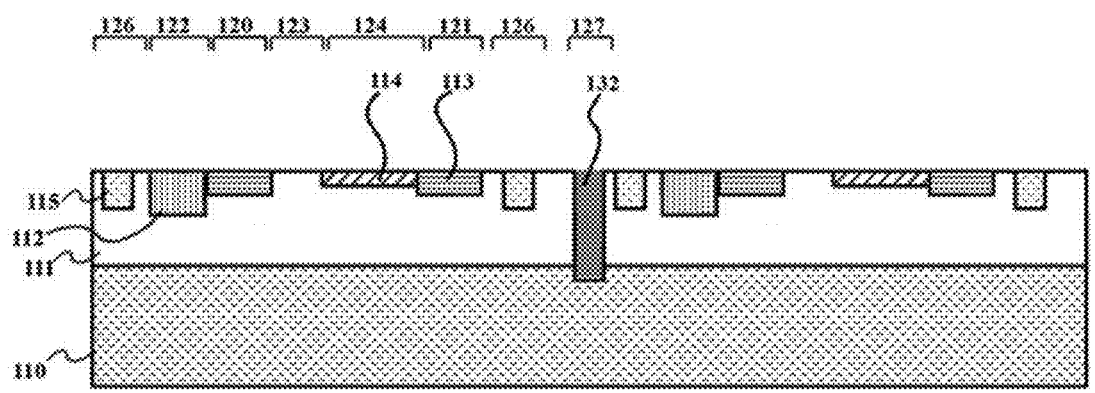
FIG. 6 illustrates a fabrication process of a silicon carbide device according to various aspects described herein.

Moving now to FIG. 6, a deep isolation trench 127 is etched in the area between the individual devices. Plasma-etching, for instance reactive-ion etching or inductively-coupled plasma, using hydrogen bromide or another gas, or another etching method may be used to etch this trench within the silicon carbide material. As the figure demonstrates, the isolation trench depth is required to be greater than the depth of the p-epi region to provide the necessary electrical isolation between the body regions of the neighboring LDMOS devices. These body regions are the regions of the epitaxial layer 111 neighboring the source regions 120 and drain regions 121 of the LDMOS devices 201 and 202. The trench may be wider than the trench depth to allow for easier implementation of the next steps. The trench width may further be chosen wide enough to limit dielectric breakdown in the insulating fill material between the individual devices. The chosen width needs to ensure that the electric field created across the trench by the potential difference expected to be between the body regions of two neighboring devices does not exceed a fraction of the breakdown field limit of the fill material.

The width of the trench is determined based on the following factors: The highest expected potential difference between the body regions to either side of the trench, the breakdown field (material property) of the insulating material which is used as the main filling material in the trench, and a safety margin factor desired by the designer. As an example and not by limitation, when SiO2, with a breakdown field of 8 MV/cm, is used as the fill material and the maximum voltage difference is expected to be 400 V, the designer may choose ½ as the safety factor, desiring that the field across the insulating fill SiO2 never to exceed ½ of the breakdown field. In this case, the minimum trench width would be set as [400 V]/[4 MV/cm]=1 micrometer. In some embodiments, the trench depth-to-width ratio is chosen to be between 10 and 0.1.

After the isolation trench formation, the wafer may undergo a thermal oxidation process to line the sidewalls of the trench with insulating silicon dioxide (SiO2). A thin layer of etch-stop material for a subsequent chemical-mechanical polishing step, for instance silicon nitride (Si3N4), about 100 nm in thickness, may then be deposited using plasma-enhanced chemical vapor deposition or another method, over the entire wafer, including within the trenches. For clarity, the thermal oxidation layer is not shown as a separate layer in the figures except in FIGS. 1D and 1E, and the etch-stop layer is not shown as a separate layer in the figures except in FIG. 1D. The trench is then filled with the insulating material 132, which may be silicon dioxide (SiO2) deposited with a method such as plasma-enhanced chemical vapor deposition (PECVD), or any other suitable insulating material which can fill this trench. This material then may be planarized to yield a smooth surface on the top of the wafer, by chemical-mechanical polishing (CMP) or another suitable method depending on the selection of the fill material and etch-stop material.

Figure 7A:
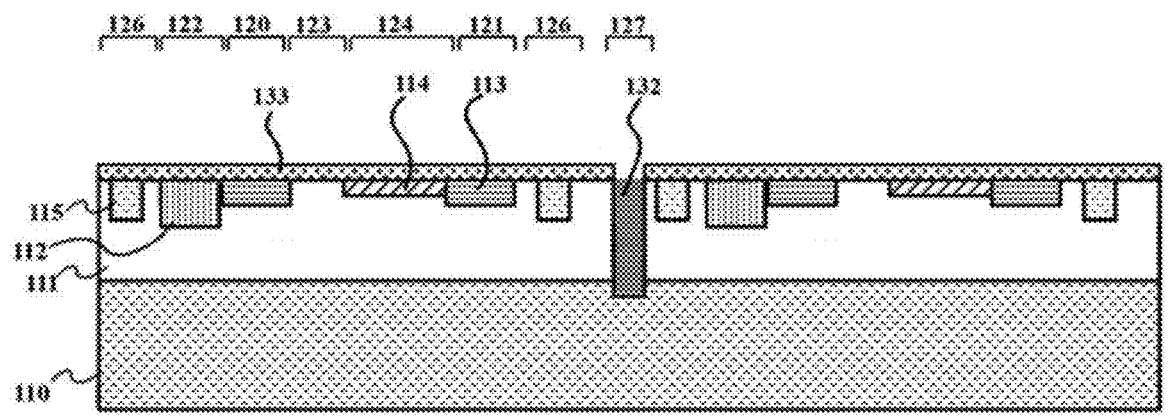
FIG. 7A illustrates a fabrication process of a silicon carbide device according to various aspects described herein.
Figure 7B:
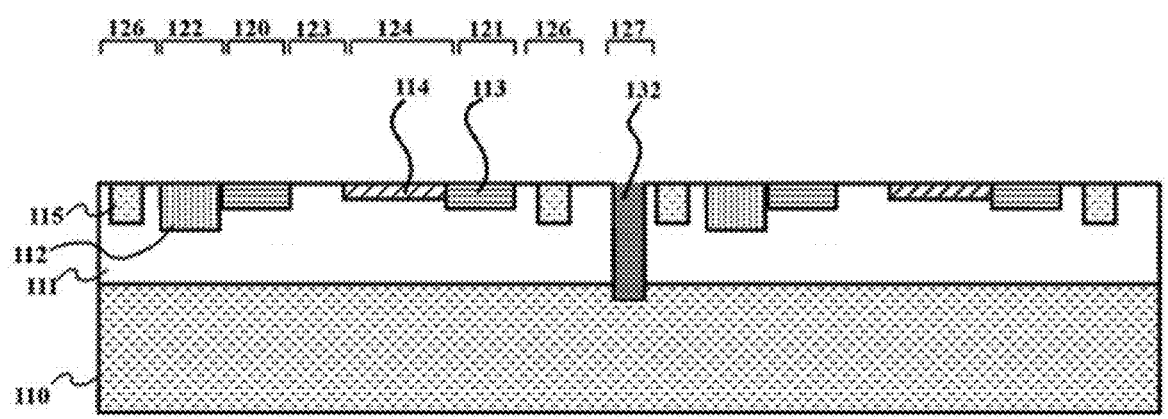
FIG. 7B illustrates a fabrication process of a silicon carbide device according to various aspects described herein.

FIG. 7A shows the growth of a sacrificial oxide 133, and FIG. 7B shows the removal of this sacrificial oxide. The sacrificial oxide 133 is a layer of native oxide SiO2 grown on the silicon carbide surface using a thermal oxide growth method known to those of ordinary skill in the art to a thickness exceeding 10 nm. The growth of the sacrificial oxide 133 has the effect of removing a surface layer of silicon carbide from the top surface epitaxial layer 111 on top of the bare semiconductor material by converting the SiC to SiO2. This process is applied to smooth the top surface of the epitaxial layer 111 and remove some imperfections, impurities and defects in the crystal which may be present near this top surface of the epitaxial layer 111. After the growth, the sacrificial oxide 133 is then removed, before any further processing steps are performed, by a wet etching method such as using a buffered oxide etch, or any other method that would be known to one of ordinary skill in the art.

Figure 8A:
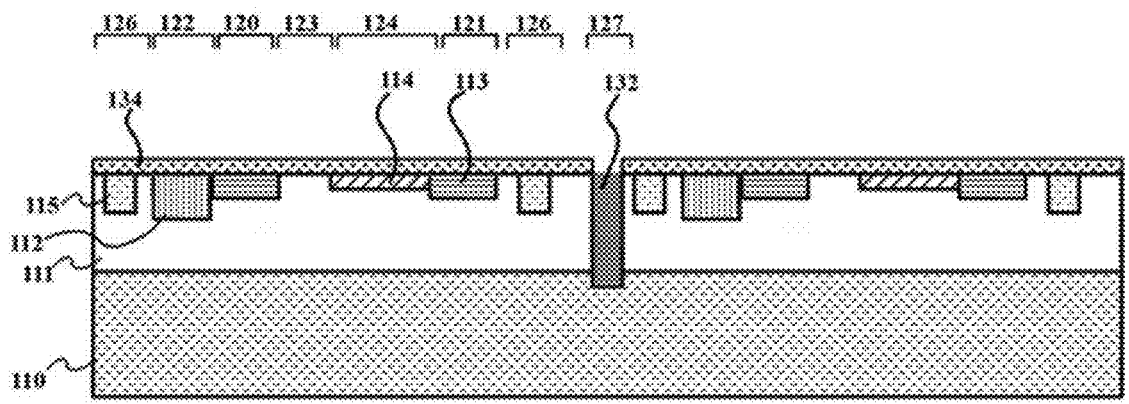
FIG. 8A illustrates a fabrication process of a silicon carbide device according to various aspects described herein.
Figure 8B:
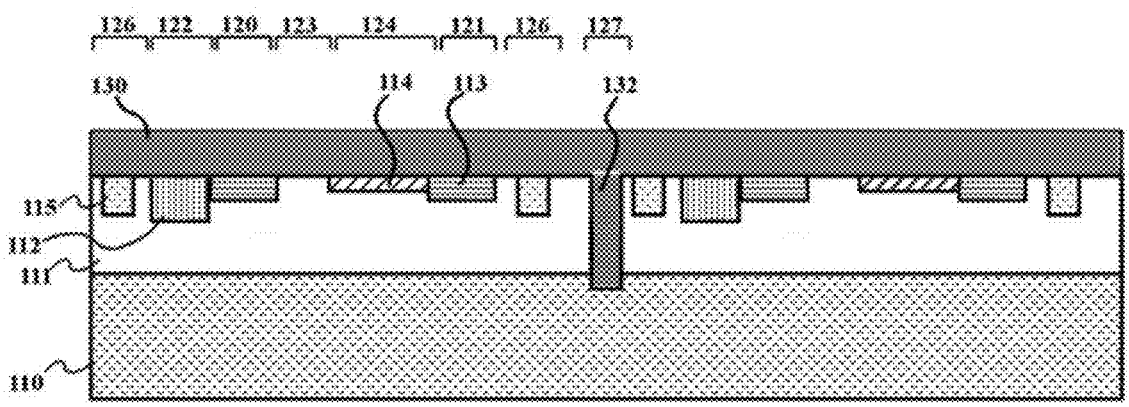
FIG. 8B illustrates a fabrication process of a silicon carbide device according to various aspects described herein.

Following the removal of the sacrificial oxide 133, a surface passivation oxide 134 is grown thermally as shown in FIG. 8A to a thickness of between about 5 nm and 50 nm. In the illustrated implementation the thickness is about 30 nm. (Note the drawings are not to scale.) In one implementation, the surface passivation oxide 134 is not removed from the surface before the deposition of field oxide 130, but for the clarity in the drawings, the surface passivation oxide is not shown in subsequent drawings. The surface passivation oxide 134 is grown using a thermal oxide growth method known to those of ordinary skill in the art. For example, and not by limitation, the semiconductor wafer may be placed in an oven into which an oxygen flow is introduced and maintained at a temperature of around 1100 C for a time period of around 3 hours. FIG. 8B shows the deposition of the field oxide 130. The field oxide 130 is deposited using a method such as PECVD (plasma-enhanced chemical vapor deposition) or another oxide deposition method known to those of ordinary skill in the art to a thickness of between about one-half and one micrometer.

Figure 9A:
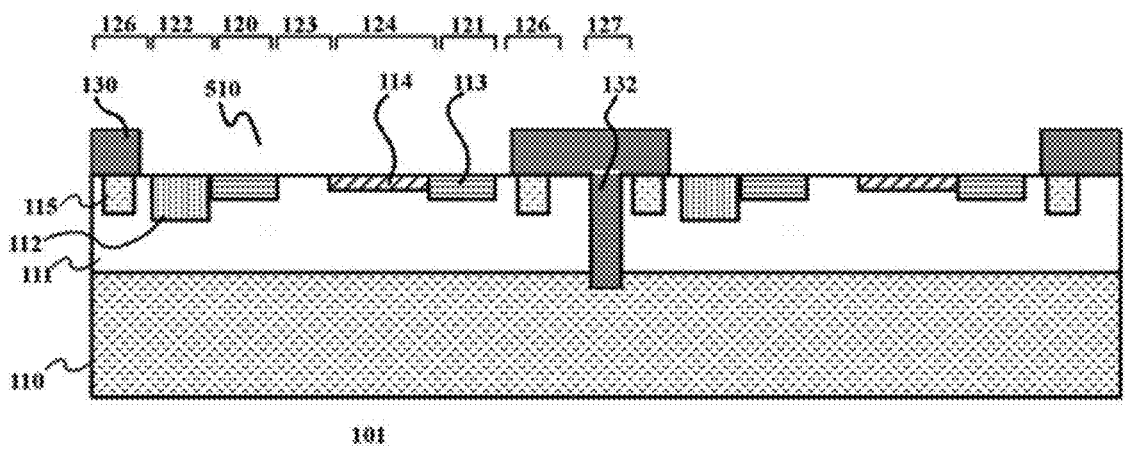
FIG. 9A illustrates a fabrication process of a silicon carbide device according to various aspects described herein.
Figure 9B:
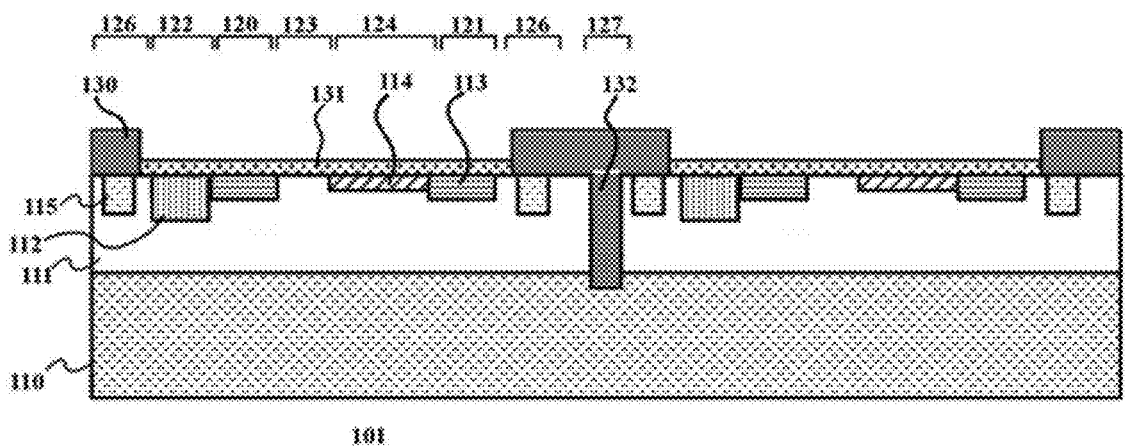
FIG. 9B illustrates a fabrication process of a silicon carbide device according to various aspects described herein.

FIG. 9A shows openings 510 that are created in the field oxide 130 to define regions where the gate oxide 131 will be grown. These openings at a minimum need to cover the gate structure, source, drain, and body contact regions of the LDMOS devices 201 and 202. FIG. 9B shows the growth of an insulating layer or the gate oxide 131, which will form the basis of the gate structure of the LDMOS devices 201 and 202. In some embodiments, other gas environments, for example and not by limitation, an NO environment, may be used instead of the N2O environment, and the other oxidation parameters such as temperature and duration may be adjusted for different environments.

Figure 10A:
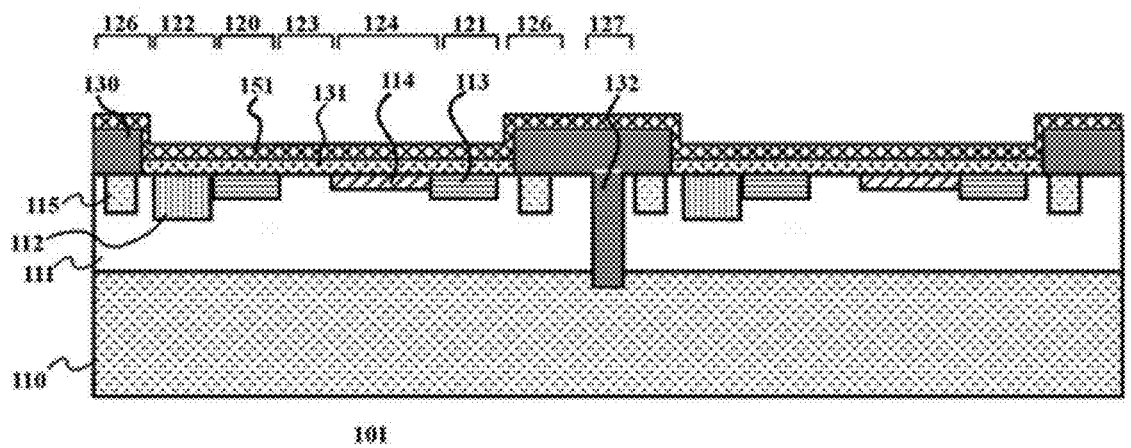
FIG. 10A illustrates a fabrication process of a silicon carbide device according to various aspects described herein.
Figure 10B:
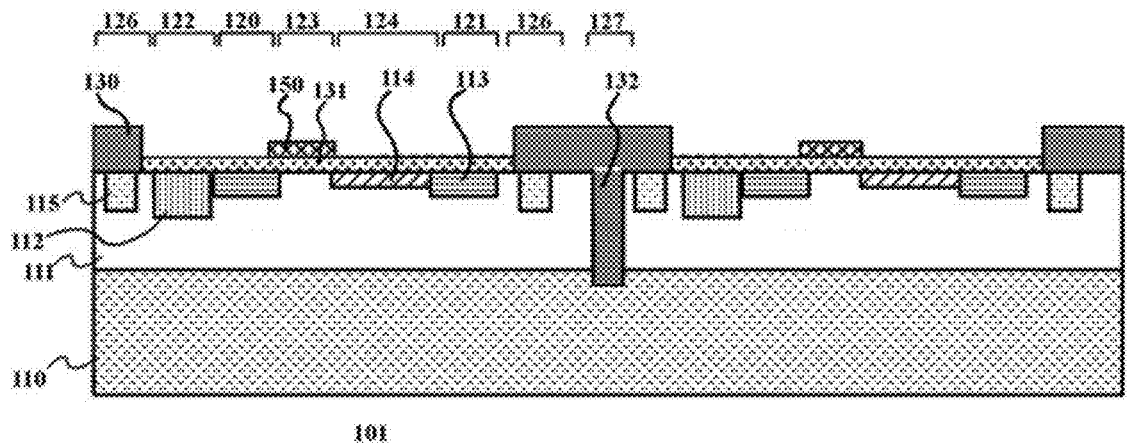
FIG. 10B illustrates a fabrication process of a silicon carbide device according to various aspects described herein.

In FIG. 10A, a polysilicon layer 151 is deposited on the structure following the growth of the gate oxide 131. Following the deposition of the polysilicon layer 151, this layer is doped, and a drive-in anneal step is conducted in order to make it function as a MOSFET gate material layer. Note, only the final state of the structure is shown in FIG. 10A following these steps. FIG. 10B shows the completed gate structures of the LDMOS devices 201 and 202 after the patterning of the polysilicon layer 151 to form the gate structures, where each gate structure includes gate material 150, formed for example with polysilicon, and the gate oxide 131 immediately underneath the gate material 150.

Figure 11:
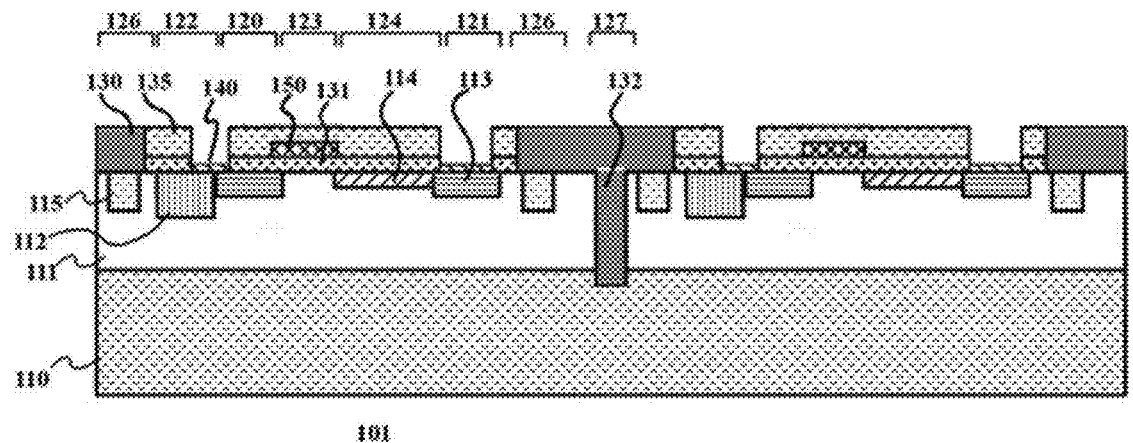
FIG. 11 illustrates a fabrication process of a silicon carbide device according to various aspects described herein.

FIG. 11 shows the metallization procedure used to create the ohmic contacts to the semiconductor and the interconnect contacts to the polysilicon gates in the LDMOS devices 201 and 202. Following the deposition of an interlayer dielectric (insulating oxide) 135, this layer and the gate oxide 131 remaining in the openings of the field oxide 130 that are not covered by the gate structures is etched to form openings for the ohmic contact metal layer deposition as shown in FIG. 11. In FIG. 11, the ohmic contact metal layer has been deposited, patterned, and annealed to form the ohmic contact metallic regions 140. (Only the final stage is shown for conciseness.)

Figure 12:
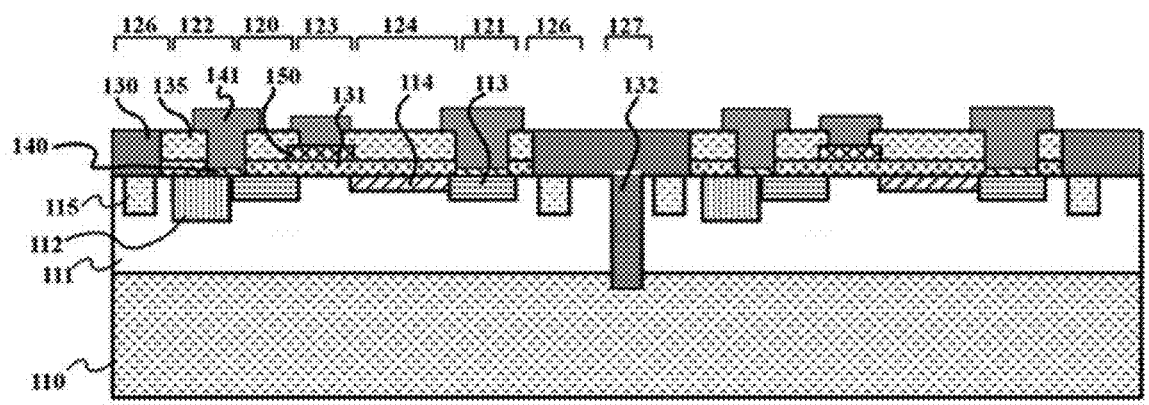
FIG. 12 illustrates a fabrication process of a silicon carbide device according to various aspects described herein.

FIG. 12 shows the deposition of a first interconnect metal layer, which contacts the ohmic contact metallic regions 140 and the polysilicon layers 151 over the gate structures. The interlayer dielectric 135 is first etched down to the level of the polysilicon layer 151 in the areas where contact will be made. Following the deposition of the metal layer 141, this layer is patterned to form a desired interconnection network. (Only the final stage is shown in the Figure for conciseness.) One of skill in the relevant art(s) will readily recognize that additional inter-dielectric layers and interconnect metal layers can be stacked on top of the structure to provide additional metal interconnection networks. Note that the two LDMOS devices formed this way are not electrically connected. Such a connection where required would be formed by metal layer 141 or another metal layer to be formed subsequently above what is shown in this figure crossing over the isolation trench.

Although the drawings describe operations in a specific order and/or show specific arrangements of components and are described in the context of silicon carbide LDMOS devices integrated together on a single semiconductor die, one should not interpret that such specific order and/or arrangements limit the scope of the present disclosure, or that all the operations performed and the components disclosed are needed to obtain a desired result.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein.

Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus, the following claims are hereby incorporated into the Detailed Description, with each claim standing on its own as a separately claimed subject matter.

What is claimed is:

1. A method of forming a Silicon Carbide (SiC) integrated circuit comprising:
    selecting a wafer for forming the SiC integrated circuit having a bulk layer with a first doping type and doping an epitaxial layer with a second doping type opposite of the first doping type to block current from flowing from the epitaxial layer to the bulk layer under normal voltage bias conditions and operation;
    forming a source region and a drain region for a first LDMOS device and a second LDMOS device in an epitaxial layer on the bulk layer;
    forming an isolation trench by etching between the first LDMOS device and the second LDMOS device, the isolation trench having sidewalls and a bottom;
    growing a thin layer of thermal oxide on the sidewalls and the bottom of the isolation trench;
    filling the isolation trench with an insulating trench fill material over the thermal oxide;
    forming in the epitaxial layer a body region of first LDMOS device and a body region of the second LDMOS device, wherein the body region of the first LDMOS and the body region of the second LDMOS device are electrically isolated from each other by the insolation trench, allowing the first LDMOS device and the second LDMOS device to exist on a same die and have different voltage bias levels maintained at body nodes of the first LDMOS and the second LDMOS device;
    completing the first LDMOS device and the second LDMOS device including forming gate structures and metallization layers; and
    packaging the first LDMOS device and second LDMOS device formed together in the epitaxial layer on the bulk layer of the SiC integrated circuit as a single semiconductor die in a single package.

2. The method as set forth in claim 1, further comprising etching the isolation trench sufficiently deep to go partially into the bulk layer to separate the body region of first LDMOS device and the body region of the second LDMOS device electrically, and wherein the trench completely surrounds the region within which each LDMOS device is defined.

3. The method as set forth in claim 1, wherein the isolation trench has a minimum width to prevent dielectric breakdown due to a voltage difference created by different voltage levels set in the body region of the first LDMOS device and the body region of the second LDMOS device.

4. The method as set forth in claim 3, wherein the minimum width of the isolation trench is determined by:
    a safety margin times a maximum potential voltage across the isolation trench divided by a breakdown field property for the isolation trench fill material.

5. The method as set forth in claim 1, further comprising filling the isolation trench with a trench fill material that comprises an insulating dielectric material selected to prevent dielectric breakdown due to voltage differences created by different bias levels set for the body region of the first LDMOS device and the body region of the second LDMOS device.

6. The method as set forth in claim 5, wherein the isolation trench fill material is selected from silicon dioxide, silicon nitride, undoped polysilicon, and a combination silicon dioxide silicon nitride and undoped silicon.

7. The method as set forth in claim 1, further comprising growing a thermal oxidation layer lining the isolation trench and filling a remainder of the isolation trench with the trench fill material.

8. The method as set forth in claim 1, further comprising etching the isolation trench to include beveled sidewalls.

9. The method as set forth in claim 1, further comprising selecting the wafer with the bulk and epitaxial layer being alternately n or p type.

10. The method as set forth in claim 1, where the bulk layer that falls directly below the epitaxial layer which houses the first LDMOS device and the second LDMOS device comprises an insulating layer such as intrinsic SiC.

11. The method as set forth in claim 1, further comprising a second epitaxial layer of insulating material such as intrinsic SiC between the bulk layer and the epitaxial layer which houses the first LDMOS device and the second LDMOS device.

12. The method as set forth in claim 1, further comprising an edge termination region, which is an implant area surrounding a circumference of the first LDMOS device and the second LDMOS device.

13. The method as set forth in claim 12, wherein the edge termination region is a region implanted with a dopant of the same type and higher density than that of the body region.

14. The method as set forth in claim 12, wherein the edge termination structure comprises multiple rings, rectangles, or other circumferential geometries, encircling both the first LDMOS device and the second LDMOS device.

15. The method as set forth in claim 1, further comprising a third LDMOS device and a fourth LDMOS device fabricated on the single semiconductor die and wherein the first LDMOS device, the second LDMOS device, the third LDMOS device and the fourth LDMOS device are connected in a full bridge topology.

* * * * *